(12) United States Patent
Liu et al.

(10) Patent No.: US 6,291,355 B1
(45) Date of Patent: Sep. 18, 2001

(54) METHOD OF FABRICATING A SELF-ALIGNED CONTACT OPENING

(75) Inventors: Haochieh Liu, Taipei; Bor-Ru Sheu, Hsinchu; Hsi-Chuan Chen; Sen-Huan Huang, both of Tainan, all of (TW)

(73) Assignee: Windbond Electronics Corp., Hsinchu (TW)

( * ) Notice: Subject to any disclaimer, the term of this patent is extended or adjusted under 35 U.S.C. 154(b) by 0 days.

(21) Appl. No.: 09/404,498

(22) Filed: Sep. 23, 1999

(30) Foreign Application Priority Data

Aug. 23, 1999 (TW) .................................................. 88114373

(51) Int. Cl.[7] .............................................. H01L 21/3065
(52) U.S. Cl. .......................... 438/706; 438/710; 438/712; 438/713; 438/714
(58) Field of Search ..................................... 438/706, 710, 438/712, 725, 637, 638, 639, 253, 259, 260

(56) References Cited

U.S. PATENT DOCUMENTS

| | | | |
|---|---|---|---|
| 5,670,404 | * | 9/1997 | Dai ........................................ 438/239 |
| 5,780,339 | * | 7/1998 | Liu et al. ............................... 438/253 |
| 5,879,986 | * | 3/1999 | Sung ..................................... 438/253 |
| 6,080,620 | * | 6/2000 | Jeng ...................................... 438/253 |

* cited by examiner

*Primary Examiner*—Benjamin L. Utech
*Assistant Examiner*—Lan Vinh
(74) *Attorney, Agent, or Firm*—Jiawei Huang; J.C. Patents (57) ABSTRACT

A fabrication method for a self-aligned contact opening involves using polysilicon to protect a cap layer above a conductive line or even a corner of a spacer on a sidewall of the conductive line. A silicon oxide layer is then etched using a conventional silicon oxide etching recipe to form a self-aligned contact opening. This conventional silicon oxide etching recipe not only has a higher etching selectivity for silicon oxide to silicon nitride, but also yields a higher etching selectivity ratio for silicon oxide to polysilicon.

11 Claims, 10 Drawing Sheets

METHOD OF FABRICATING A SELF-ALIGNED CONTACT OPENING

CROSS-REFERENCE TO RELATED APPLICATION

This application claims the priority benefit of Taiwan application Ser. No. 88114373, filed Aug. 23, 1999.

BACKGROUND OF THE INVENTION

1. Field of Invention

The present invention relates to a fabrication method for a self-aligned contact opening. More particularly, the present invention relates to a method for improving the self aligned effect of the self-aligned contact opening using polysilicon in order to reduce loss of a cap layer above a word line and a spacer on a sidewall of the word line.

2. Description of Related Art

In the deep sub-micron integrated circuit (IC) process, an opening with smaller size is often formed using a self-aligned contact process. Since the self-aligned contact process indirectly increases the process window of the photolithography, the size of the chip is reduced by using the self-aligned contact process.

In the conventional self-aligned contact process, a nitride cap layer is formed on a word line, with a nitride spacer forming on a sidewall of the word line. A silicon oxide layer is then formed to cover the cap layer and the spacer before coating a photoresist layer on the silicon oxide layer. After the photoresist layer is patterned using photolithography, the silicon oxide layer is etched, using a silicon oxide etching recipe with high etching selectivity for silicon oxide to silicon nitride and the photoresist layer serving as an etching mask. During the etching process, the silicon nitride cap layer above the word line and the silicon nitride spacer on the sidewall of the word line may serve as a secondary mask, so that a self-aligned contact opening is formed in the silicon oxide layer. The self-aligned contact opening is then filled with tungsten or polysilicon to form a plug.

However, some oxygen atoms may be released from the silicon oxide layer into the etching environment when the silicon oxide layer is etched using the conventional silicon oxide etching solution. As the amount of oxygen atoms in the etching solution increases, the degree to which the silicon nitride cap layer and the silicon nitride spacer are removed also increases. As a result, the etching selectivity for silicon oxide to silicon nitride is reduced, causing a more serious parasitic capacitance effect between the word line and the plug, thus the transmission rate of the word line and its adjacent plug are also affected. In an even more serious case, a shortcircuit occurs between the plug and its adjacent word line. With the trend to continuously reduce size of the device, the bottom width of the silicon nitride spacer on the sidewall of the word line is also reduced according to the design rule. This makes performance of the self-aligned contact process even more difficult.

SUMMARY OF THE INVENTION

The invention provides a method for improving the etching selectivity for silicon oxide to silicon nitride without changing the conventional silicon oxide etching recipe, so as to form a self-aligned contact opening with better quality.

As embodied and broadly described herein, the invention provides a method for fabricating a self-aligned contact opening. The method involves forming a conductive line on the substrate, wherein the conductive line is covered by a nitride cap layer and a nitride spacer. A gap between the conductive lines is filled with a silicon oxide layer, while the surface of the nitride cap layer is exposed. A polysilicon layer is selectively formed on the exposed nitride cap layer, followed by forming a photoresist layer, which covers a part of the polysilicon layer and the silicon oxide layer. With the photoresist layer serving as a principal etching mask, and the polysilicon layer as a secondary etching mask, an etching process is performed. The silicon oxide etching recipe having high etching selectivity for silicon oxide to nitride is used in the etching process, so that the self-aligned contact is formed in the silicon oxide layer. The photoresist layer is then removed.

According to the preferred embodiment, the nitride spacer is also included as a secondary mask during the etching step if the surface of the silicon oxide layer is approximately level with the surface of the nitride cap layer. However, the polysilicon layer may extend to a corner of the nitride spacer and has a bumper shape if the surface of the silicon oxide layer is lower than the surface of the nitride cap layer.

Furthermore, the invention provides another fabrication method for a self-aligned contact opening, which method involves forming a conducting layer, a nitride insulating layer, and a polysilicon layer in sequence on a substrate. These layers are then patterned to form a conductive line, a nitride cap layer, and a polysilicon protective layer. A nitride spacer is formed on a sidewall, which covers the conductive line, the nitride cap layer, and the polysilicon protective layer, so that the conductive line is covered by the nitride cap layer and the nitride spacer. A silicon oxide layer is formed to cover the polysilicon protective layer and the nitride spacer. The silicon oxide layer is planarized with a photoresist layer formed thereon. With the photoresist layer serving as a principal etching mask, and the polysilicon protective layer as a secondary mask, an etching process is performed. An etching recipe having high etching selectivity for silicon oxide to nitride is used in the etching process, so that a self-aligned contact opening is formed in the silicon oxide layer. The photoresist layer is then removed.

According to the preferred embodiment, the surface, of the silicon oxide layer is higher than or level with the surface of the polysilicon protective layer after the silicon oxide layer is planarized.

In addition, the invention provides another fabrication method for a self-aligned contact opening, which method involves forming a conducting layer, a nitride insulating layer, and a polysilicon layer in sequence on a substrate. These layers are then patterned to form a conductive line, a nitride cap layer, and a polysilicon protective layer. A nitride spacer is formed on a sidewall, which covers the conductive line, the nitride cap layer, and the polysilicon protective layer. A silicon oxide layer is formed to fill a gap between the conductive lines, while the surface of the nitride cap layer and a corner of the nitride spacer are exposed. The exposed nitride spacer is then protected by a polysilicon spacer formed thereon. A photoresist layer is formed to cover the silicon oxide layer, the polysilicon protective layer, and the polysilicon spacer. With the photoresist layer serving as a principal etching mask, and the polysilicon protective layer as a secondary mask, an etching process is performed. An etching recipe having high etching selectivity for silicon oxide to nitride is used in the etching process so as to form a self-aligned contact opening in the silicon oxide layer. The photoresist layer is then removed.

The fabrication method for the self-aligned contact opening described above adopts the conventional silicon oxide etching recipe and polysilicon to reduce or even prevent loss of the nitride cap layer and the nitride spacer around the conductive line. Since the silicon oxide etching recipe has high etching selectivity for silicon oxide to polysilicon, a polysilicon layer may serve as a protective layer in the invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

First Embodiment

Reference is made to FIGS. 1A to 1E, which illustrate the fabrication steps for a self-aligned contact opening according to a first embodiment of this invention, so that the chance of short-circuiting between a gate electrode and a conductive plug is reduced. The word line is used as an example for the conductive line in the present embodiment.

Figure 1A:
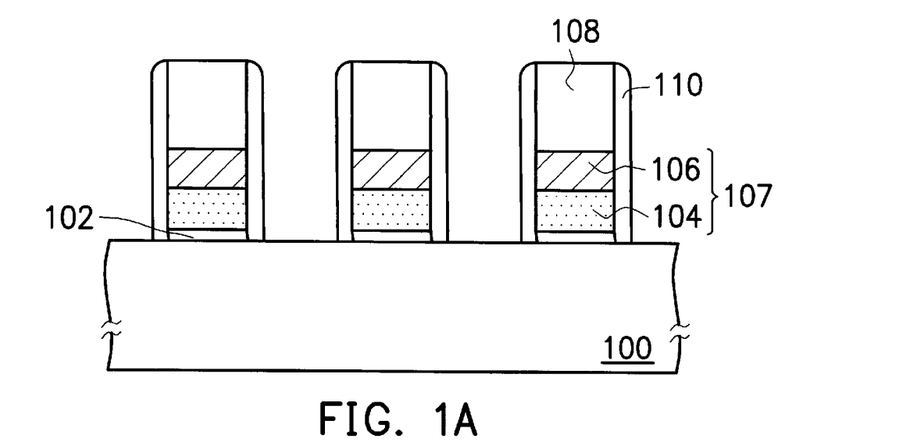
FIGS. 1A to 1E are schematic, cross-sectional diagrams showing the fabrication steps for a self-aligned contact opening according to a first embodiment of this invention.

Referring to FIG. 1A, a substrate 100, such as a P-type semiconductor silicon substrate, is provided. After a device isolation structure (not shown) is formed in the substrate 100 to define an active region of the device, a field effect transistor (FET) is formed on the active region. The FET may include a gale oxide layer 102, a word line 107, and a source/drain (S/D) region (not shown), wherein the word line 107 of the FET is made by stacking a polysilicon layer 104 and a silicide layer 106. The silicide layer 106 may include material such as tungsten silicide (WSi). In addition, a nitride cap layer 108 made of material such as silicon nitride is formed on the word line 107, while a nitride spacer 110 made of silicon nitride is formed on a sidewall of the nitride cap layer 108.

Figure 1B:
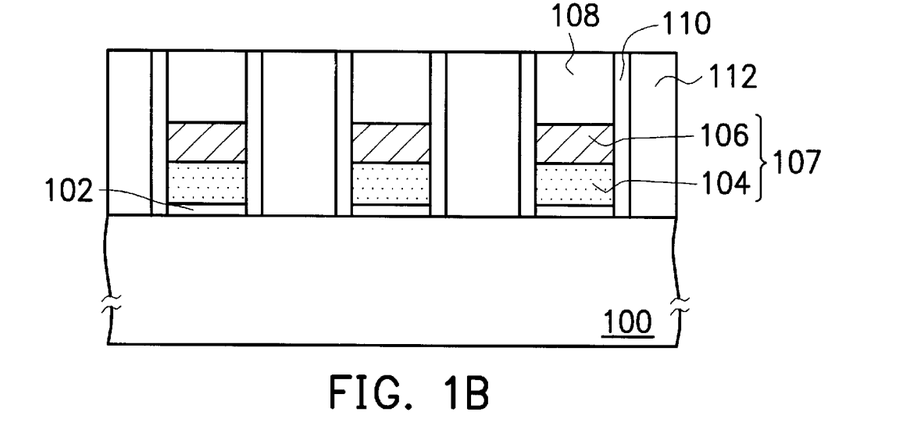

Referring to FIG. 1B, a silicon oxide layer 112 is formed by, for example, chemical vapor deposition (CVD) to cover the overall structure described above. A part of the silicon oxide layer is then removed by chemical mechanical polishing (CMP) until the nitride cap layer and nitride spacer are exposed. This forms silicon oxide layer 112 as illustrated in the diagram, wherein the silicon oxide layer 112 is approximately level with the nitride cap layer 108.

Figure 1C:
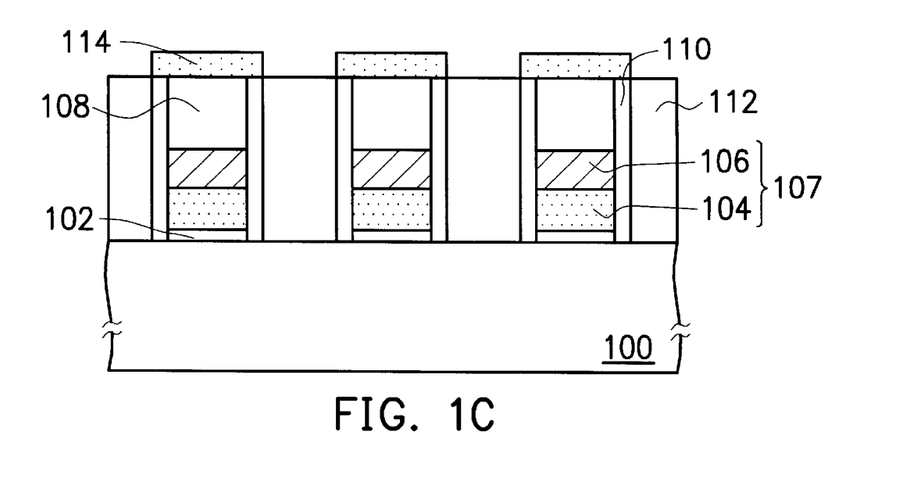

Referring to FIG. 1C, a polysilicon layer 114 is selectively formed to cover the exposed portion of the nitride cap layer 108 and nitride spacer 110, wherein the polysilicon layer 114 has a thickness of about 2–200 nm. It should be noted, however, that no polysilicon is grown on the surface of the silicon oxide layer in this step.

Figure 1D:
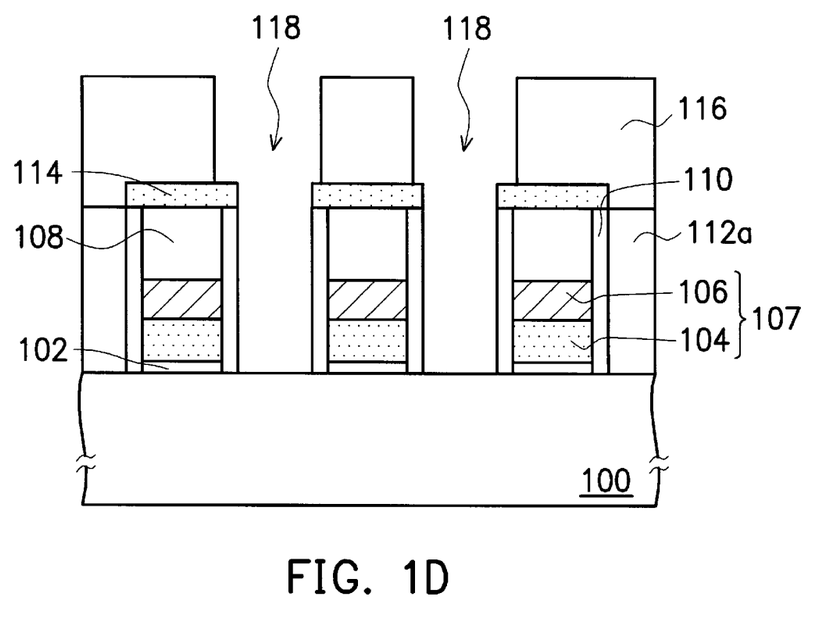

Referring to FIG. 1D, a photoresist layer 116 is formed to cover a part of the polysilicon layer 114 and silicon oxide layer 112. With the photoresist layer 116 serving as a principal etching mask, and the polysilicon layer 114 as a secondary mask, an etching process is performed to form a self-aligned contact opening 118 which exposes the substrate 100. The etching solution for etching the silicon oxide layer 112 includes carbon fluoride etching solution such as $C_4F_8$, $CH_2F_2$, or $C_5F_8$. The etching solution further includes Ar, $O_2$, CO, and so on.

It is known that some oxygen atoms may be released from the silicon oxide layer into the etching environment when the silicon oxide layer is etched using the conventional etching solution. As the amount of oxygen atoms in the etching solution increases, the degree to which the silicon nitride cap layer and the silicon nitride spacer are removed also increases. However, the polysilicon layer 114 provided by the invention can protect the nitride cap layer 108 and the nitride spacer 110, thus preventing direct contact with the etching solution in the anisotropic etching environment. This reduces loss of the nitride cap layer and the nitride spacer, while improving reliability of the electrical isolation between the word line 107 and the subsequently formed conductive plug.

Figure 1E:
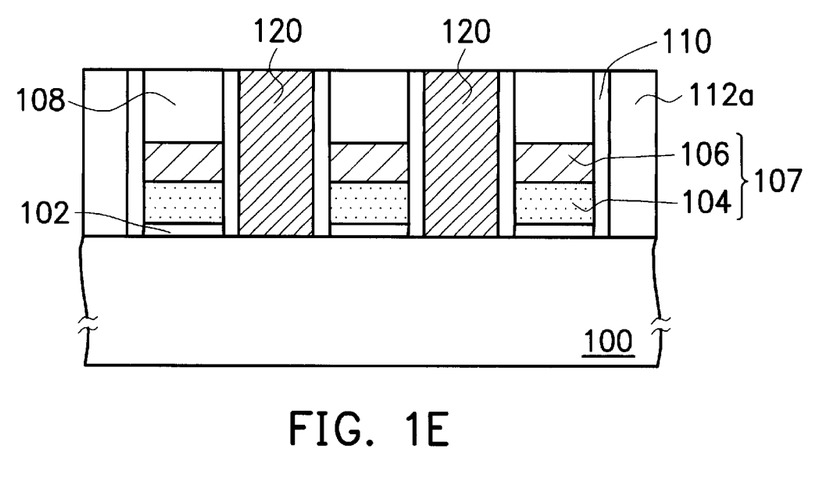

Referring to FIG. 1E, a conducting layer (not shown) is formed to cover the polysilicon layer 114 and the silicon oxide layer 112 as well as to fill the self-aligned contact opening 118 after the photoresist layer 116 is removed by conventional method. The polysilicon layer 114 on the nitride cap layer 108 and the excessive conducting layer are then removed, so that the conducting layer only fills the self-aligned contact opening 118 to form a conductive plug 120 shown in the diagram. The conductive layer in this case may include polysilicon, tungsten, and the like.

Second Embodiment

Reference is made to FIGS. 2A to 2D, which illustrate the fabrication steps for a self-aligned contact opening according to a second embodiment of the invention. As a result, the chance of short-circuiting between a conductive line and a conductive plug is reduced, while the isolation between the conductive line and the conductive plug is improved. The word line is used as an example for the conductive line in the present embodiment.

Figure 2A:
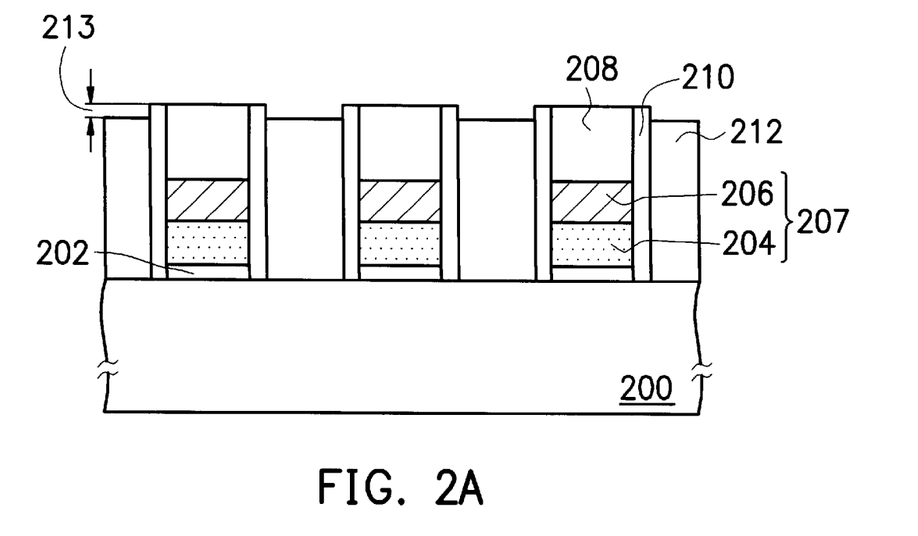
FIGS. 2A to 2D are schematic, cross-sectional diagrams showing the fabrication steps for a self-aligned contact opening according to a second embodiment of this invention.

Reference is made to FIG. 2A, where most of the device mentioned here shares the same structure but different reference numerals with those in FIG. 1A. In this case, the overall structure comprises a substrate 200, a gate oxide layer 202, a word line 207, a polysilicon layer 204, a silicide layer 206, a nitride layer 208, and a nitride spacer 210. The rest of the description is made with reference to the first embodiment.

A silicon oxide layer is formed to cover the overall structure described above by CVD, followed by removing the excessive silicon oxide layer by anisotropic etching, such as wet etching or anisotropic dry etching until the nitride cap layer 208 and the nitride spacer 210 are exposed. This forms the silicon oxide layer 212 illustrated in the diagram, wherein the surface of the silicon oxide layer 212 is lower than the surface of the nitride cap layer by a distance 213, and the distance 213 is about 10–200 nm.

Figure 2B:
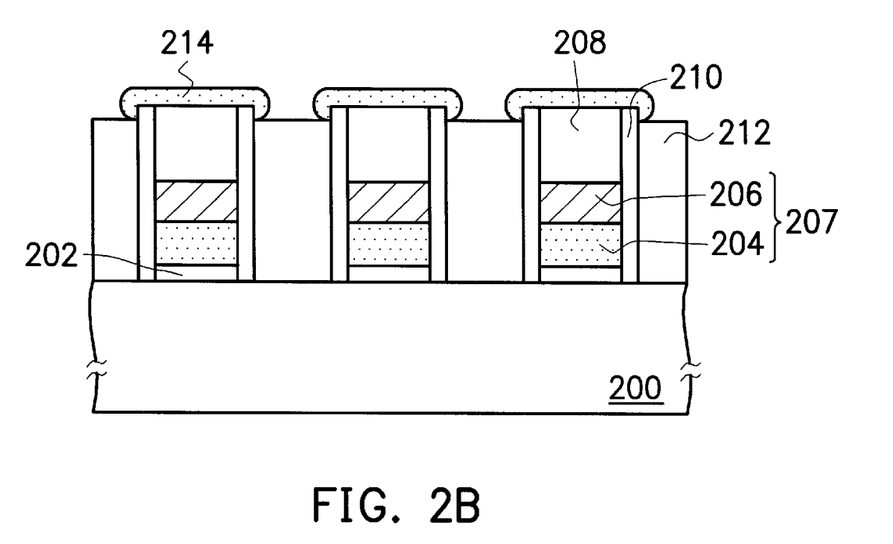

Referring to FIG. 2B, a selective polysilicon layer 214 is formed to cover the nitride cap layer 208 and top portion of the nitride spacer 210, wherein the polysilicon layer 214 has a thickness of about 2–200 nm. It should be noted that no polysilicon is grown on the surface of the silicon oxide layer 212 in this step. Since the surface of the silicon oxide layer 212 is lower than the surface of the nitride cap layer 208, the polysilicon layer 214 is formed to have a bumper shape, while the polysilicon layer 214 formed as such can protect a corner of the nitride spacer 210 more completely.

Figure 2C:
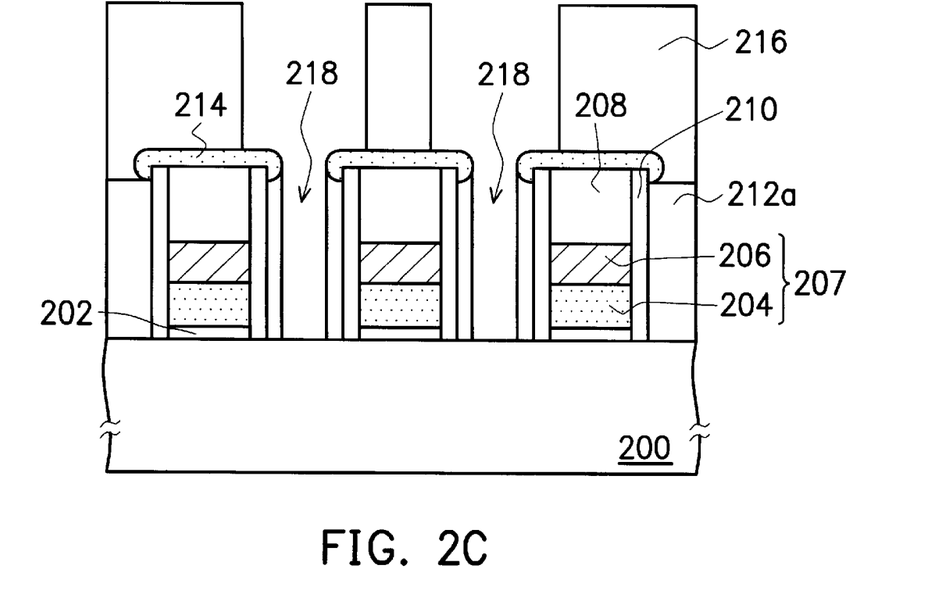

Referring to FIG. 2C, a photoresist layer 216 is formed to cover a part of the polysilicon layer 214 and silicon oxide layer 212. With the photoresist layer 216 serving as a principal etching mask, and the polysilicon layer 214 as a secondary mask, an etching process is performed. This changes the silicon oxide layer 212 into the silicon oxide layer 212a illustrated in the diagram, so that a self-aligned contact opening 218 which exposes the substrate 200 is formed within. The etching solution for etching the silicon oxide layer 212 in this case is similar to the one described in the first embodiment. As the polysilicon layer 214 has a bumper shape during formation of the self-aligned contact opening 218, a part of the silicon oxide layer 212a adjacent to the sidewall of the nitride spacer 210 and below the polysilicon layer 214 is not removed. Therefore, the silicon oxide layer 212a that remains not only prevents loss of the nitride spacer 210 exposed to the etching environment, but further improves the isolation between the word line 207 and the subsequently formed conductive plug.

Figure 2D:
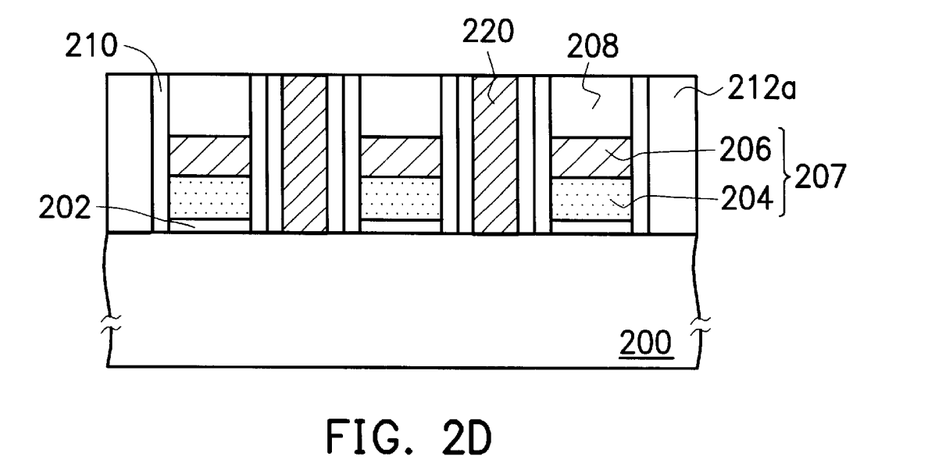

Referring to FIG. 2D, a conducting layer is formed to cover the polysilicon layer 214 and the silicon oxide layer 212a and fill the self-aligned contact opening 218 after the photoresist layer 216 is removed by conventional method. The polysilicon layer 214 on the nitride cap layer 208 and the excessive conducting layer are then removed, so that the conducting layer only fills the self-aligned contact opening 218 to form a conductive plug 220 shown in the diagram. The conductive layer in this case may include polysilicon, tungsten, and the like.

Third Embodiment

Reference is made to FIGS. 3A to 3G, which illustrate the fabrication steps for a self-aligned contact opening according to a third embodiment of this invention, so that the chance of short-circuiting between a conductive line and a conductive plug is reduced.

Figure 3A:
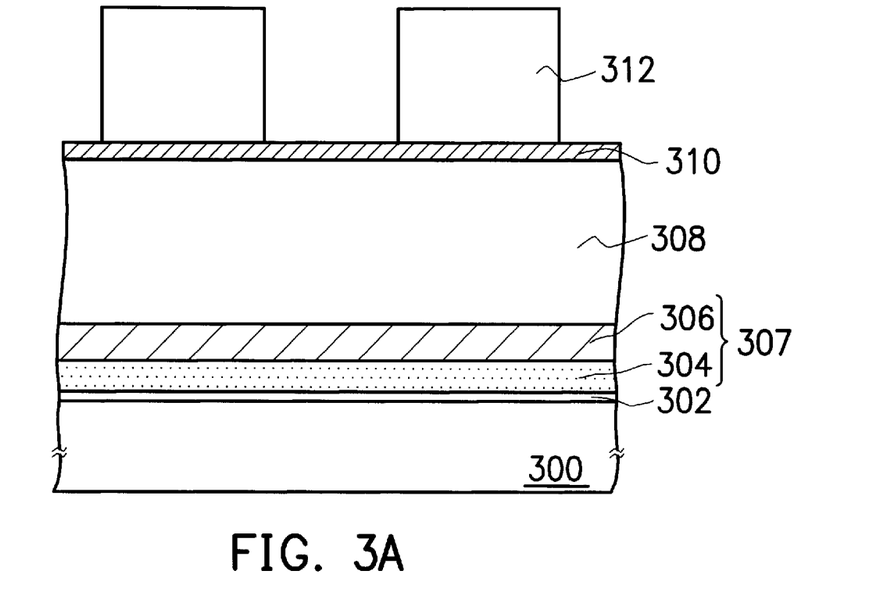
FIGS. 3A to 3G are schematic, cross-sectional diagrams showing the fabrication steps for a self-aligned contact opening according to a third embodiment of this invention.

Referring to FIG. 3A, an oxide layer 302, a conducting layer 307, a nitride insulating layer 308, and a polysilicon layer 310 are formed in sequence on a substrate 300. The conducting layer 307 is formed by stacking a polysilicon layer 304 and a silicide layer 306. The silicide layer 306 in this case includes tungsten silicide, while the nitride insulating layer 308 includes silicon nitride. The nitride insulating layer 308 has a thickness of about 2–200 nm. Subsequently, a photoresist layer 312 is formed on the polysilicon layer 310.

Figure 3B:
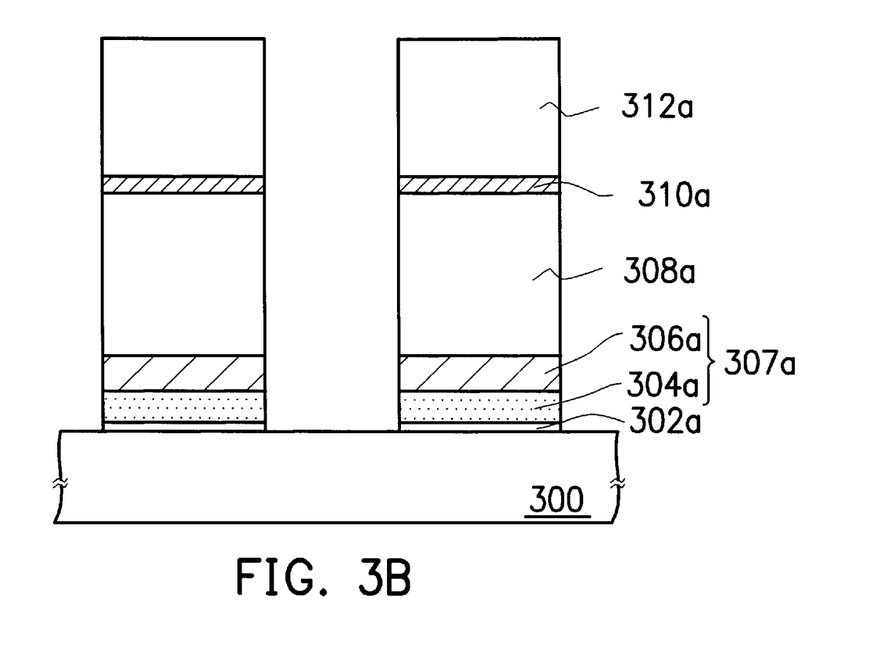

Referring to FIG. 3B, with the photoresist layer 312 serving as an etching mask, anisotropic etching is performed to form the gate oxide layer 302a, the word line 307a, the nitride cap layer 308a, and the polysilicon protective layer 310a, respectively.

Figure 3C:
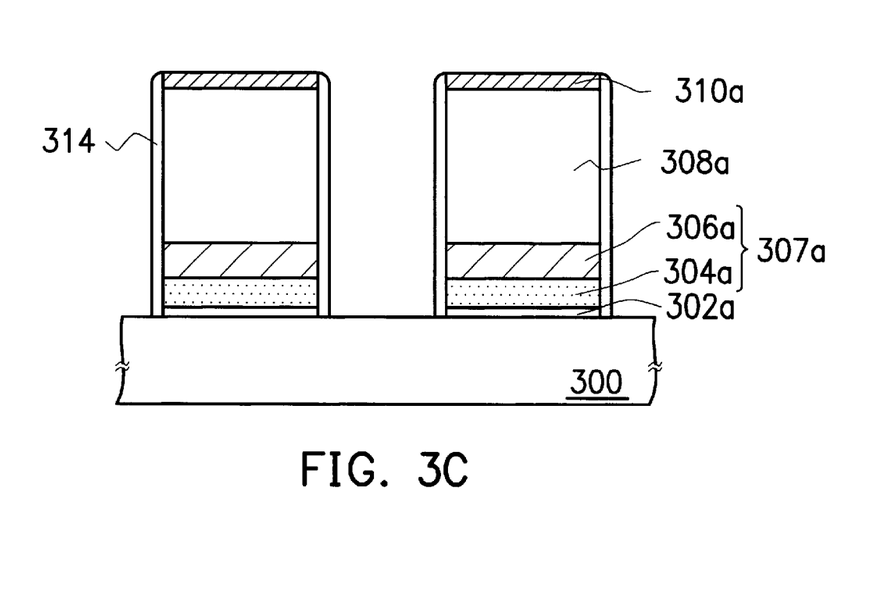

Referring to FIG. 3C, a nitride spacer 314 is formed on a sidewall of the gate oxide layer 302a, the word line 307a, the nitride cap layer 308a, and the polysilicon protective layer 310a, after the photoresist layer 312 is removed, by conventional method. The nitride spacer 314 may include silicon nitride, wherein the nitride spacer 314 has a bottom width of about 10–80 nm.

Figure 3D:
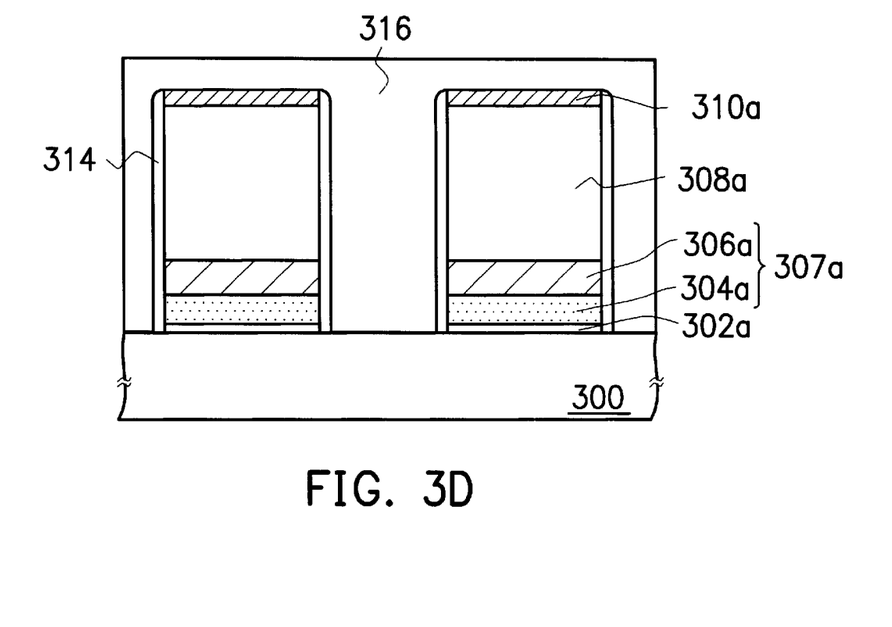

Referring to FIG. 3D, a planarized silicon oxide layer 316 is formed to cover the overall structure described in FIG. 3C, wherein the silicon oxide layer 316 is planarized by CMP.

The silicon oxide layer 316 formed as such has its surface level with or even higher than the surface of the polysilicon protective layer 310a, with the previous situation being preferred in the present embodiment.

Figure 3E:
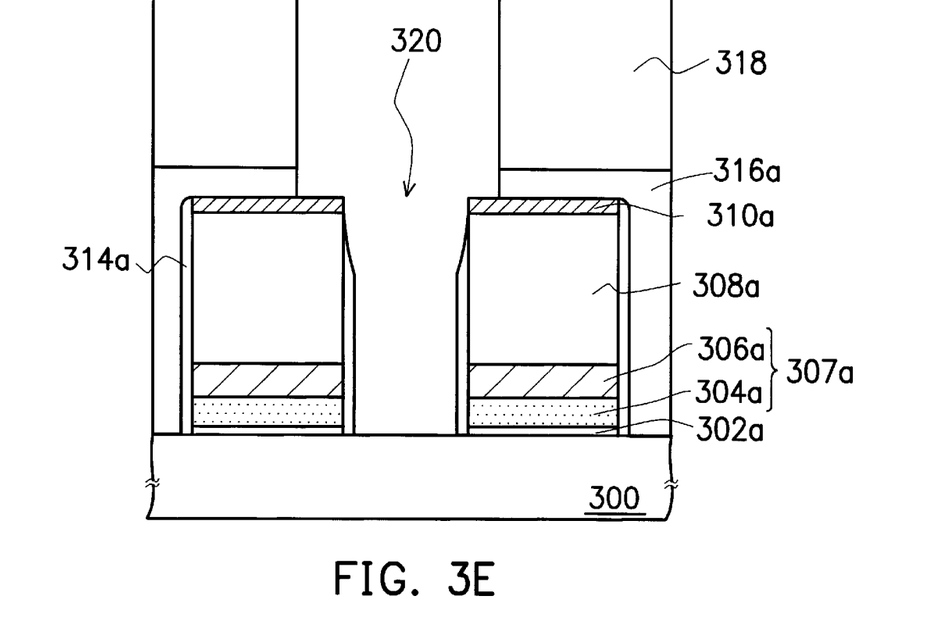

Referring to FIG. 3E, a photoresist layer 318 is formed on the silicon oxide layer 316. With the photoresist layer 318 serving as an etching mask, and the polysilicon protecting layer 310a as a secondary mask, an etching process is performed. This changes the silicon oxide layer 316 into the silicon oxide layer 316a illustrated in the diagram, so that a self-aligned contact opening 320, which exposes the substrate 300, is formed. The etching solution for etching the silicon oxide layer 316 in this case is similar to the one described in the first embodiment. Since the polysilicon protective layer 310a provides protection for the nitride cap layer 308a during formation of the self-aligned contact opening 320, this prevents loss of the nitride cap layer 308a. Although a part of the nitride spacer 314 unprotected by the polysilicon protecting layer 310a is removed to form the nitride spacer 314a, such loss can almost be negligible in comparison with the conventional result. Therefore, the reliability of the electrical isolation between the word line 307a and the subsequently formed conductive plug is improved.

Figure 3F:
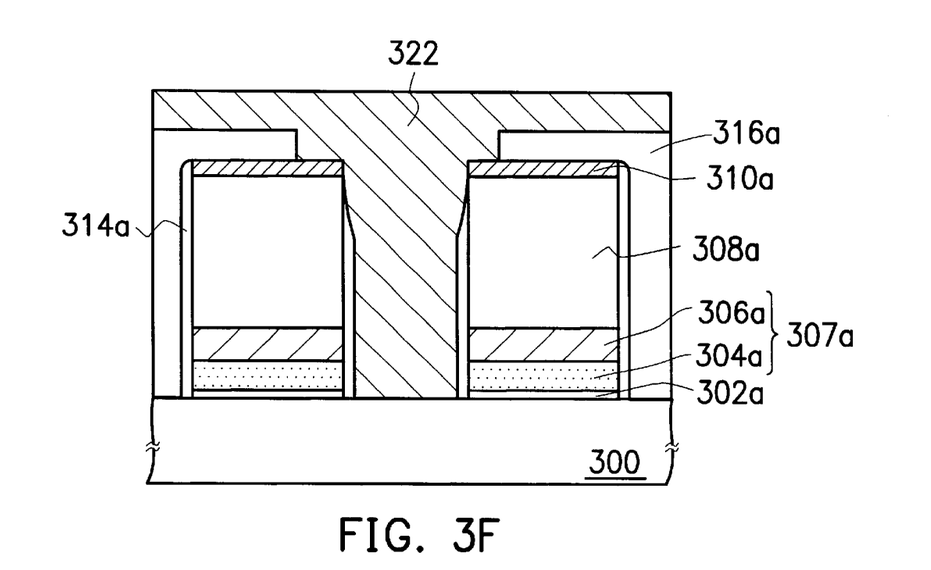

Referring to FIG. 3F, a conducting layer 322 which covers the silicon oxide layer 316a and fills the self-aligned contact opening 320 is formed after the photoresist layer 318 is removed by a conventional method. The conductive layer 322 in this case may include polysilicon, tungsten, and the like.

Figure 3G:
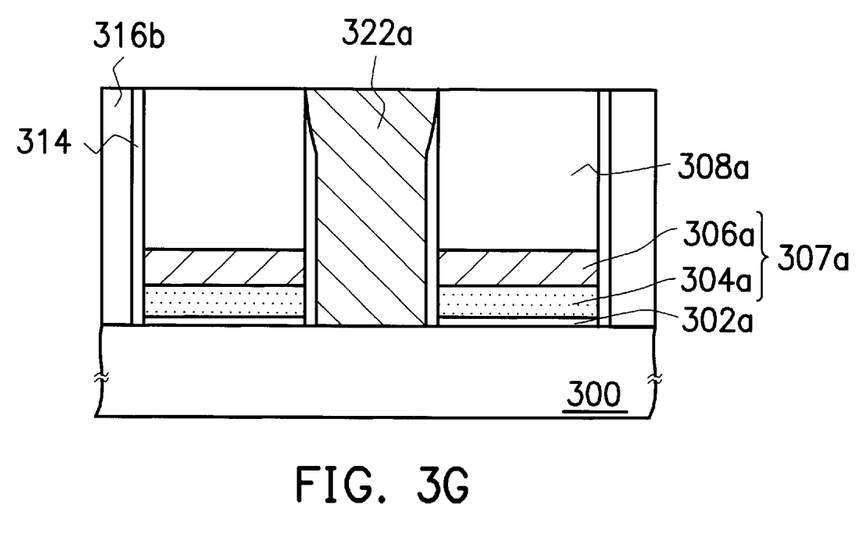

Referring to FIG. 3G, the polysilicon protective layer 310a, a portion of the silicon oxide layer 316a, and the excessive conducting layer 322 above the nitride cap layer 308a are removed by a process such as CMP or etch back. As a result, a conductive plug 322a is formed in the self-aligned contact opening 320 as illustrated in the diagram, wherein the silicon oxide layer 316a changes into the silicon oxide layer 316b as illustrated in the diagram.

Fourth Embodiment

Reference is made to FIGS. 4A to 4E, which illustrate the fabrication steps for a self-aligned contact opening according to a fourth embodiment of this invention. As a result, the chance of short-circuiting between a conductive line and a conductive plug is reduced, while the isolation between the conductive line and the conductive plug is improved.

Figure 4A:
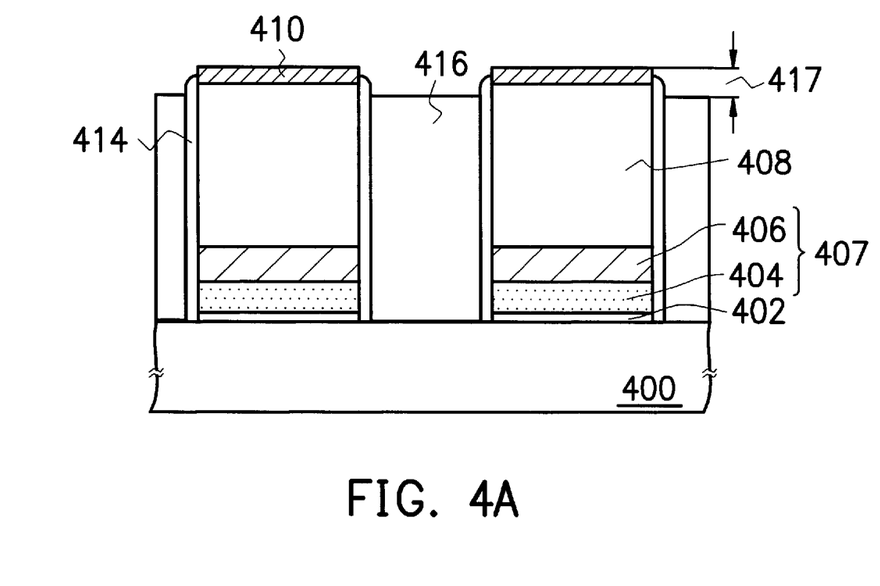
FIGS. 4A to 4E are schematic, cross-sectional diagrams showing the fabrication steps for a self-aligned contact opening according to a fourth embodiment of this invention.

Reference is to FIG. 4A, where most of the device mentioned here shares the same structure but different reference numerals with those in FIG. 3A. In this case, the overall structure comprises a substrate 400, a gate oxide layer 402, a word line 407 comprising a polysilicon layer 404 and a silicide layer 406, a nitride layer 408, a polysilicon protective layer 410, and a nitride spacer 414. The rest of the description is made with reference to the third embodiment.

A silicon oxide layer is formed to cover the overall structure described above by CVD. The silicon oxide layer is then planarized by CMP, followed by removing the excessive silicon oxide layer by anisotropic etching, such as wet etching or anisotropic dry etching until the nitride cap layer 408 and the nitride spacer 414 are exposed. This forms the silicon oxide layer 416 illustrated in the diagram, wherein the surface of the silicon oxide layer 416 is lower than the surface of the polysilicon protective layer 410 by a distance 417, and the distance 417 is about 10–150 nm. A part of the nitride spacer 414 is removed during etching of the silicon oxide layer 416, so that the surface of the nitride spacer 414 is slightly lower than the surface of the polysilicon protective layer 410.

Figure 4B:
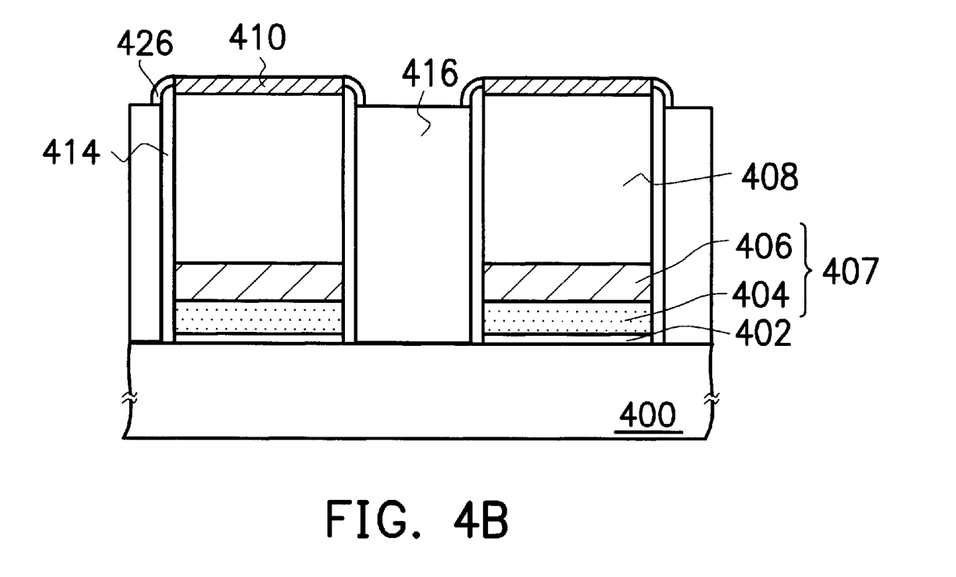

Referring to FIG. 4B, a polysilicon spacer 426 is formed to cover the sidewall of the polysilicon protective layer 410 and the exposed portion of nitride spacer 414. The method for forming the polysilicon spacer 426 involves forming a polysilicon layer having a thickness of about 5–80 nm on the substrate 100, followed by performing etch back until the silicon oxide layer 416 is exposed. Therefore, the polysilicon protective layer 410 and the polysilicon spacer 414 can completely protect the nitride cap layer 408 and a corner of the nitride spacer 414.

Figure 4C:
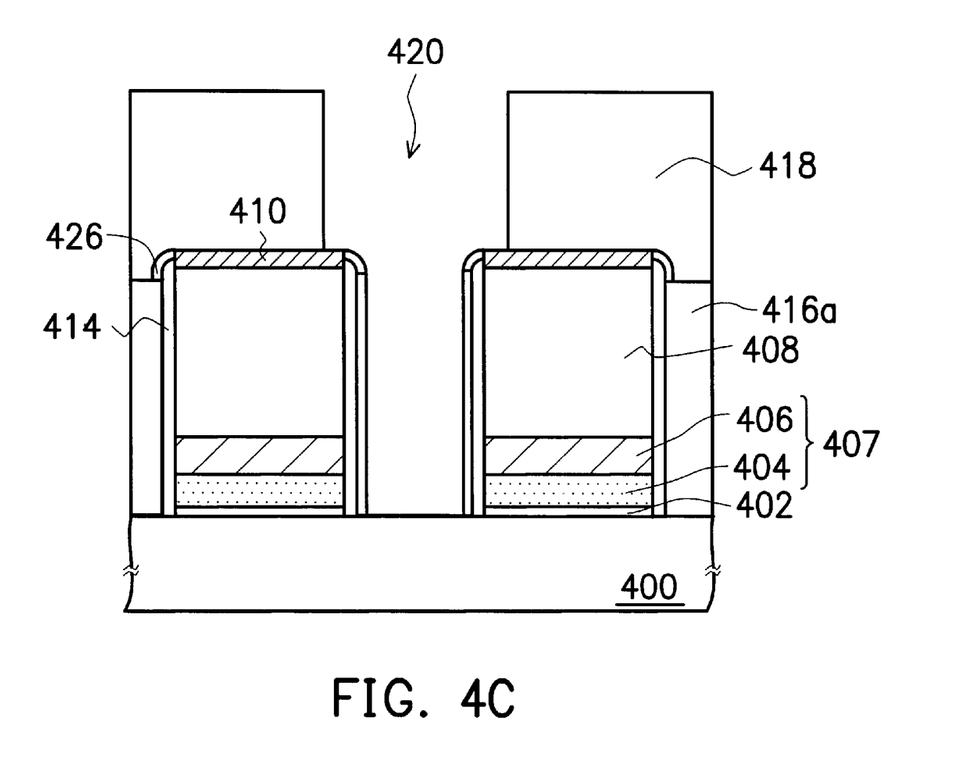

Referring to FIG. 4C, a photoresist layer 418 is formed to cover a part of the polysilicon protective layer 410, the polysilicon spacer 426, and silicon oxide layer 416. With the photoresist layer 418 serving as an etching mask and the polysilicon protective layer 410 and the polysilicon spacer 426 as a secondary mask, an etching process is performed. This changes the silicon oxide layer 416 into the silicon oxide layer 416a illustrated in the diagram, so that a self-aligned contact opening 420, which exposes the substrate 400, is formed within. The etching solution for etching the silicon oxide layer 416 in this case is similar to the one described in the first embodiment. During formation of the self-aligned contact opening 420, a part of the silicon oxide layer 416a adjacent to the sidewall of the nitride spacer 414 and below the polysilicon spacer 426 is protected by the polysilicon spacer 426 from being removed. Therefore, the silicon oxide layer 416a that remains not only prevents loss of the nitride spacer 414 exposed to the etching environment, but further improves the electrical isolation between the word line 407 and the subsequently formed conductive plug.

Figure 4D:
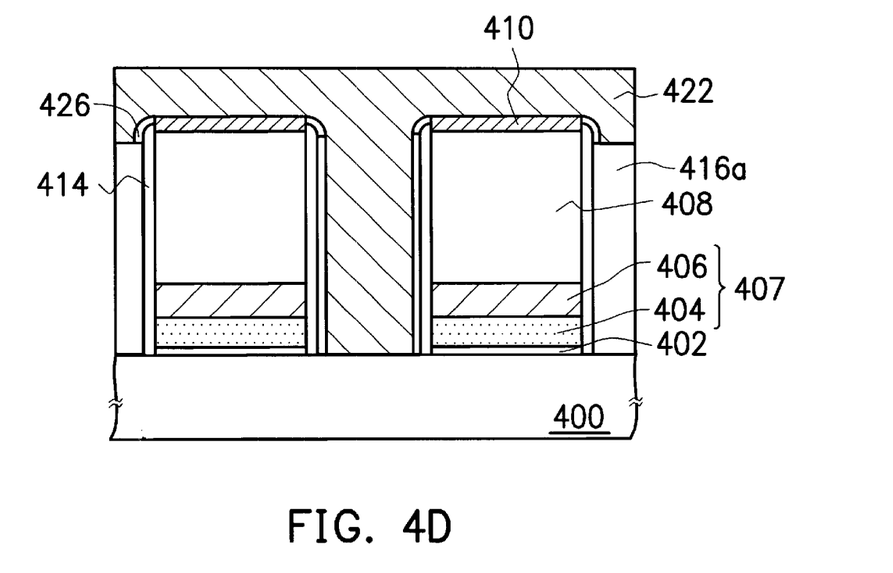

Referring to FIG. 4D, a conducting layer 422 is formed to cover the silicon oxide layer 416, polysilicon protective layer 410, and the polysilicon spacer 426 as well as to fill the self-aligned contact opening 420 after the photoresist layer 418 is removed by a conventional method. The conductive layer 422 in this case may include polysilicon, tungsten, and the like.

Figure 4E:
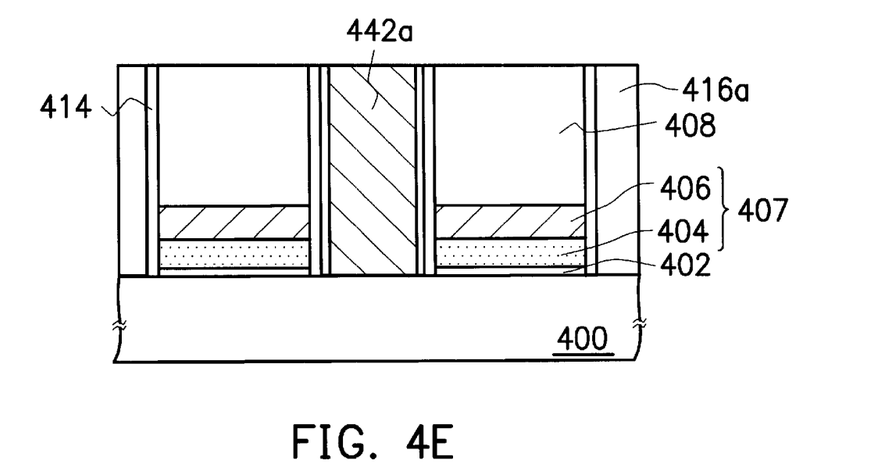

Referring to FIG. 4E, a part of the conducting layer 422, a part of the nitride cap layer 408, the polysilicon protective layer 410, the polysilicon spacer 426, and a top portion of the nitride spacer 414 adjacent to the polysilicon spacer 426 are removed. The structures described above are usually removed by a process such as CMP or etch back. As a result, the silicon oxide layer 416a and the nitride cap layer 408 are exposed and a conductive plug 422 is formed in the self-aligned contact opening 420 as illustrated in the diagram.

In the first through fourth embodiments described above, the conductive line may also include polysilicon, polycide or metal conductive line and so on. In addition, a silicon nitride liner may be optionally formed after formation of the nitride spacer and before formation of the silicon oxide layer that serves as an inter-dielectric layer.

Summarizing the above, it is understood that the invention has the following advantages. According to the present invention, the polysilicon is provided to serve as a protective layer, so that the loss of silicon nitride is reduced or prevented when the conventional etching recipe which has a higher etching selectivity for silicon oxide to polysilicon is used during etching of the silicon oxide. Alternatively, polysilicon can be substituted with other materials that have a neglecting etching rate for the conventional silicon oxide etching recipe. The method provided by the invention can reduce or even prevent loss of the silicon nitride cap layer and silicon nitride spacer around the conductive line without changing the current etching method. Due to loss of the silicon nitride cap layer and silicon nitride spacer around the conductive line invention, the electrical isolation between the conductive line and the conductive plug is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a self-aligned contact opening, the method comprising steps of:

forming a conductive line on a substrate, wherein a nitride cap layer is formed on the conductive line, and a nitride spacer is formed on a sidewall of both the conductive line and the nitride cap layer;

covering the substrate with a silicon oxide layer, and subsequently removing a part of the silicon oxide layer, so that the nitride cap layer is exposed;

selectively forming a polysilicon layer on the exposed nitride cap layer and the nitride spacer;

forming a photoresist layer which covers a part of the polysilicon layer and a remaining part of the silicon oxide layer;

performing an etching process, with the photoresist layer serving as a principal etching mask and the polysilicon layer as a secondary mask, to form a self-aligned contact opening;

removing the photoreist layer; and removing the polysilicon layer.

2. The fabrication method of claim 1, wherein the nitride cap layer and the nitride space comprise silicon nitride.

3. The fabrication method of claim 1, wherein the etching process further comprises the nitride spacer serving as a secondary etching mask.

4. The fabrication method of claim 1, wherein the polysilicon layer extends to protect a corner of the nitride spacer and has a bumber shape.

5. The fabrication method of claim 4, further comprising a part of the silicon oxide layer remaining between the self-aligned contact opening and the nitride spacer.

6. The fabrication method of claim 1, wherein a carbon fluoride etching gas is included in the etching process.

7. The fabrication method of claim 6, wherein the carbon fluoride etching gas is chosen from the group consisting of $C_4F_8$, $CH_2F_2$ and $C_5F_8$.

8. A fabrication method for a self-aligned contact opening, the method comprising steps of:

forming a conducting layer and a nitride insulating layer on a substrate;

forming a polysilicon layer on the nitride insulating layer;

patterning the conducting layer, the nitride insulating layer, and the polysilicon layer to form a conductive line, a nitride cap layer, and a polysilicon protective layer, respectively;

forming a nitride spacer on a sidewall of the conductive line, the nitride cap layer, and the polysilicon protective layer;

covering the substrate with a silicon oxide layer and subsequently removing a part of the silicon oxide layer until the polysilicon protective layer and a part of the nitride spacer are exposed;

forming a polysilicon spacer which covers the exposed nitride spacer and the sidewall of the polysilicon layer;

forming a photoresist layer to cover the silicon oxide layer, the polysilicon protective layer, and the polysilicon spacer;

performing an etching process, with the photoresist layer serving as a principal etching mask, and the polysilicon protective layer and the polysilicon spacer as a secondary mask, to form a self-aligned contact opening; and removing the photoresist layer and the polysilicon layer.

9. The fabrication of claim 8, wherein the nitride insulating layer and the nitride spacer comprise silicon nitride.

10. The fabrication method of claim 8, wherein carbon fluoride etching gas is included in the etching process.

11. The fabrication method of claim 10, wherein the carbon fluoride etching gas includes $C_4F_8$, $CH_2F_2$, or $C_5F_8$.

* * * * *